(12) United States Patent
Hall et al.

(10) Patent No.: US 11,345,569 B2
(45) Date of Patent: May 31, 2022

(54) RESCUE/EVACUATION SELF-TESTING SYSTEM FOR TRACTION ELEVATORS

(71) Applicant: Reynolds & Reynolds Electronics, Inc., Bethlehem, PA (US)

(72) Inventors: James C. Hall, Bethlehem, PA (US); Werner John Reinartz, Coopersburg, PA (US)

(73) Assignee: Reynolds & Reynolds Electronics, Inc., Bethlehem, PA (US)

( * ) Notice: Subject to any disclaimer, the term of this patent is extended or adjusted under 35 U.S.C. 154(b) by 0 days.

(21) Appl. No.: 17/355,705

(22) Filed: Jun. 23, 2021

(65) Prior Publication Data

US 2021/0387830 A1 Dec. 16, 2021

Related U.S. Application Data

(60) Division of application No. 16/871,412, filed on May 11, 2020, now Pat. No. 11,084,688, which is a continuation-in-part of application No. 16/208,702, filed on Dec. 4, 2018, now abandoned.

(51) Int. Cl.
| | |
|---|---|
| *B66B 5/00* | (2006.01) |
| *B66B 5/02* | (2006.01) |
| *B66B 1/34* | (2006.01) |
| *G01R 31/385* | (2019.01) |
| *G01R 31/396* | (2019.01) |

(52) U.S. Cl.
CPC .......... *B66B 5/0025* (2013.01); *B66B 1/3461* (2013.01); *B66B 5/0031* (2013.01); *B66B 5/0037* (2013.01); *G01R 31/386* (2019.01); *G01R 31/396* (2019.01)

(58) Field of Classification Search
CPC ... B66B 5/0025; B66B 5/0031; B66B 5/0018; B66B 5/0006; B66B 5/021
See application file for complete search history.

(56) References Cited

U.S. PATENT DOCUMENTS

| | | | |
|---|---|---|---|
| 2011/0144810 A1* | 6/2011 | Wesson | ................... B66B 5/027 700/275 |
| 2017/0260026 A1* | 9/2017 | Dominguez | ........ B66B 11/0226 |
| 2020/0071127 A1* | 3/2020 | Nikander | .............. B66B 5/0031 |

* cited by examiner

*Primary Examiner* — Christopher Uhlir
(74) *Attorney, Agent, or Firm* — Wendy W. Koba

(57) ABSTRACT

A monitoring system for controlling self-testing of a traction elevator includes a self-testing process module in communication with a three-phase AC back-up battery power supply. The self-testing process module includes a processor configured to initiate and control a series of steps for performing measurements of the three-phase AC back-up battery power supply, including measurements of the battery supply during a simulated emergency situation ("rescue/evacuation"). The processor is programmed to initiate testing on a defined schedule and transmit test results to a maintenance system (including remotely-located systems) on a routine basis. The monitoring system also includes a display unit providing visual information regarding the status of self-testing processes and their results and a communications unit for transmitting test results to a remote maintenance controller.

7 Claims, 3 Drawing Sheets

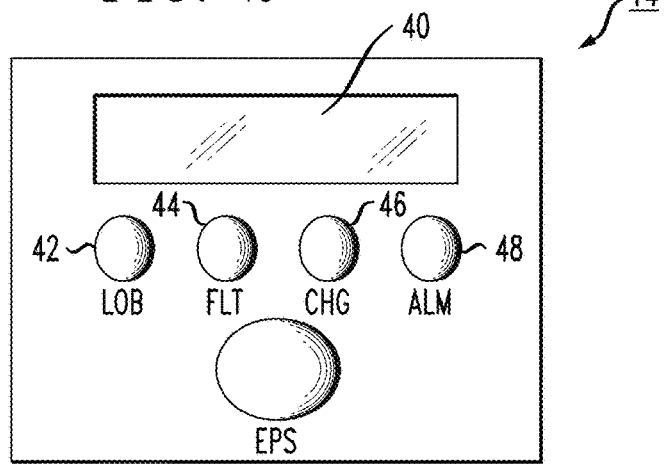
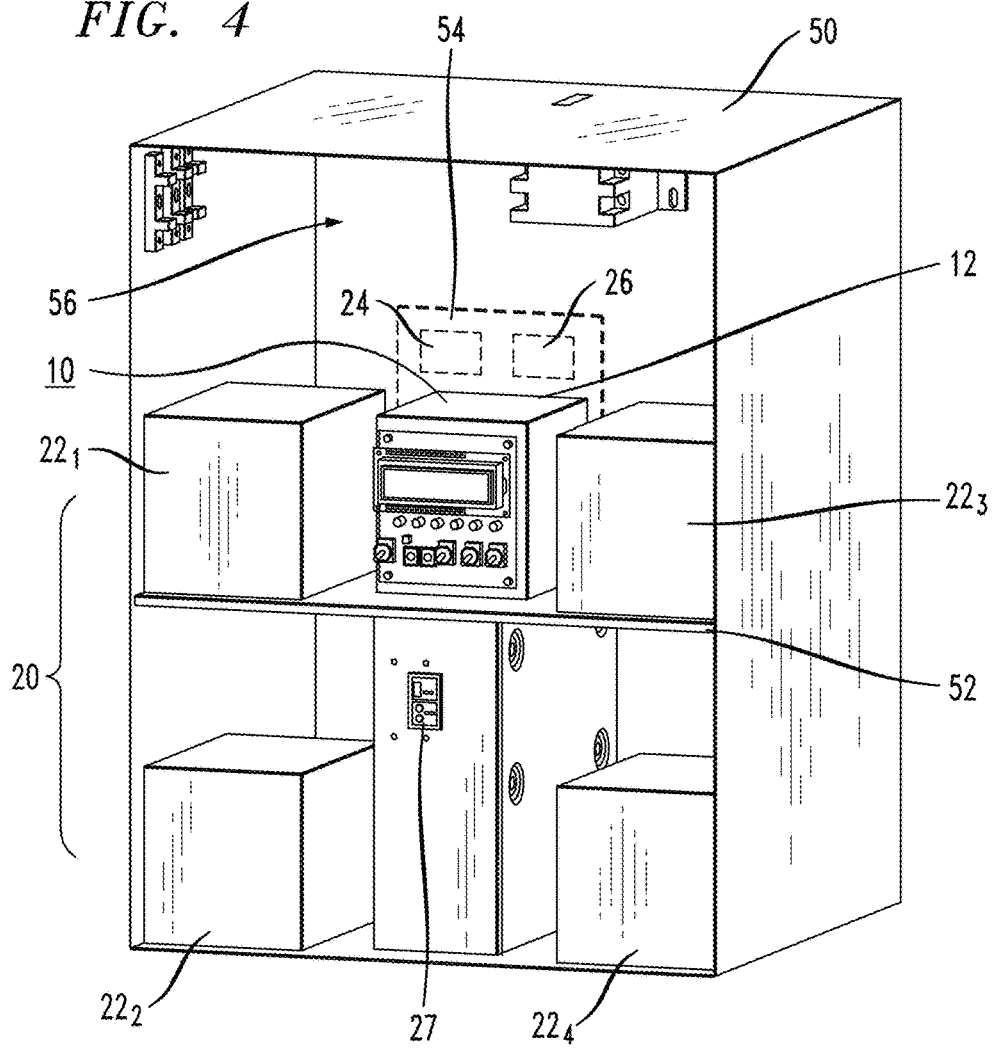

RESCUE/EVACUATION SELF-TESTING SYSTEM FOR TRACTION ELEVATORS

CROSS-REFERENCE TO RELATED APPLICATIONS

This application is a divisional of U.S. application Ser. No. 16/871,412, filed May 11, 2020, which is a continuation-in-part of U.S. application Ser. No. 16/208,702, filed Dec. 4, 2018, with both prior applications incorporated herein by reference.

TECHNICAL FIELD

The present invention relates to traction elevator systems and, more particularly, to a system for performing self-testing procedures on a traction elevator to ensure proper operation in the event of a power failure.

BACKGROUND OF THE INVENTION

A back-up power supply system is used to raise or lower an elevator car to the nearest available floor during an emergency loss of main power. The back-up power supply system stores enough energy to move the car and open the doors to eliminate any entrapment of passengers (also referred to as a "rescue/evacuation" operation).

Preferably, the back-up power supply system delivers three-phase AC power (480 VAC, 400 VAC, or in the range of 208-240 VAC depending on the elevator system requirements). The three-phase AC power output of a back-up power supply system is typically in the range of 1-8 kVa, which is considered sufficient to energize the traction elevator controller, variable frequency (VF) drive, brakes, and door motors. A typical system utilizes a stack of four batteries (a "stack" meaning a series connection of separate batteries) to provide three-phase AC back-up power.

An important aspect of providing back-up power supply system is ensuring that the system is fully charged and in operable condition. Some prior art systems for performing checks require a technician to interact with the unit and provide testing in a manual state, thus depending on the skill of the technician and a defined maintenance schedule to recognize problems before a need arises to use the back-up system. Problems such as a weak battery or completely discharged battery cell, impact the ability of the traction elevator to function as necessary in an emergency situation. Besides problems with the power level in the back-up supply, problems with the elevator car's actual rescue/evacuation system may go undiagnosed until an actual emergency occurs.

Many prior art systems have been configured to monitor only a DC output power of individual battery cells, which is not considered to be a reliable indicator of the performance of a three-phase AC back-up power supply when being used to perform rescue/evacuation operations.

SUMMARY OF THE INVENTION

The needs remaining in the art are addressed by the present invention, which relates to traction elevator systems and, more particularly, to a system for performing automated and scheduled self-testing of a three-phase AC back-up power supply of a traction elevator, including both self-testing of the three-phase AC power supply itself and at times the operation of the traction elevator during rescue/evacuation procedures, to ensure proper operation of the traction elevator in the event of a power failure.

In accordance with the principles of the present invention, a monitoring system is utilized in conjunction with a three-phase AC back-up power supply (and elevator control apparatus) to initiate self-testing of the power supply on a regular schedule and maintain a record of the test results. The self-testing of the power supply includes testing of the individual battery cells used to generate the three-phase AC back-up power, as well as the circuitry used to perform the DC to AC conversion from the batteries to the back-up power supply output. The use of a three-phase AC back-up power supply (instead of a single phase back up, which is common) is considered to be an optimum choice, inasmuch as the amount of available power from a three-phase AC system is able to not only control the motor of the traction elevator to bring the car to the nearest floor in a timely manner, but also provide sufficient power to the braking system and motor controls for the door. The results may also be sent to a remotely-located maintenance controller (via wired or wireless communication) and provide an alert about any problems that need to be immediately addressed. In an exemplary embodiment of the present invention, the self-testing further includes performing a rescue/evacuation process of the elevator car itself (i.e., powering the elevator motor with the three-phase AC back-up power supply to move to an appropriate floor and cycle through a door open/close sequence). The results of the rescue/evacuation self-test are similarly stored and transmitted off-site to a monitoring system and/or designated personnel. In this manner, any problems with the self-testing of the rescue/evacuation process are immediately brought to the attention of the proper personnel who can perform repairs in a timely fashion.

As will be described in detail below, the self-testing of the three-phase AC back-up power supply includes both an evaluation of the power supply system itself (including the charge level of the individual battery cells) and a test of the battery stack under actual rescue/evacuation conditions.

In preferred embodiments of the present invention, the monitoring system includes a visual display mounted in a location on the traction elevator system that is used by technicians or others involved in maintenance activities.

One exemplary embodiment of the present invention takes the form of a monitoring system for controlling self-testing of a traction elevator, comprising a self-testing process module in communication with a three-phase AC back-up battery power supply and an elevator control system. The self-testing process module includes a processor configured to initiate and control a series of steps for performing measurements of the back-up battery power supply, including measurements of the battery supply under evacuation/rescue procedures. In accordance with the invention, the processor is programmed to initiate testing on a defined schedule. The monitoring system also includes a display unit providing visual information regarding the status of self-testing processes and their results, a database in communication with the back-up battery power supply and the elevator control system (the database storing results of self-testing processes) and a communications unit for transmitting test results to a remote maintenance controller.

Other and further embodiments and aspects of the present invention will become apparent during the course of the following discussion and by reference to the accompanying drawings.

BRIEF DESCRIPTION OF THE DRAWINGS

Referring now to the drawings,

FIG. 2 illustrates an exemplary display that may form part of the inventive monitoring system;

FIG. 4 is an isometric view of the components forming the back-up power supply system.

DETAILED DESCRIPTION

Figure 1:
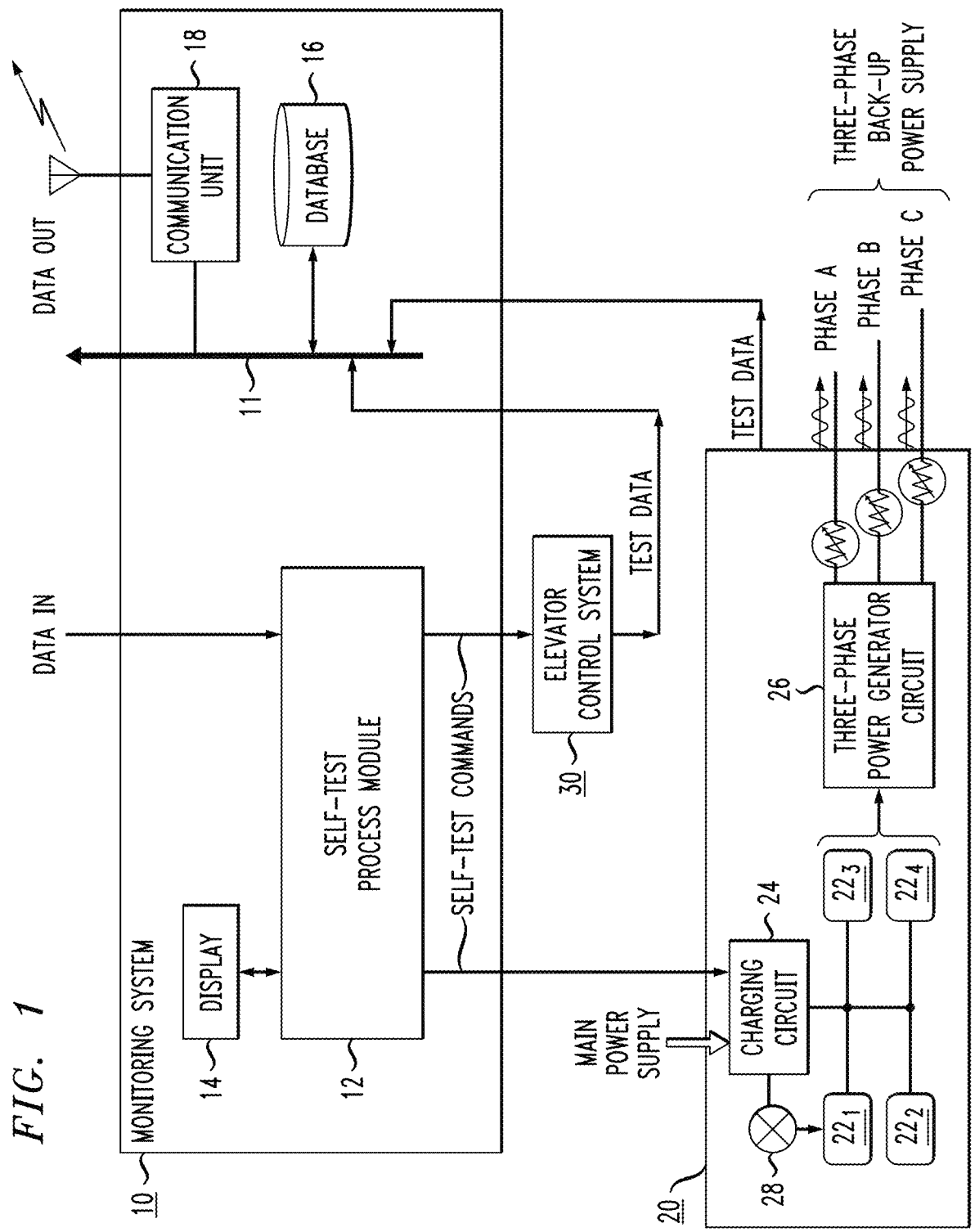
FIG. 1 is a simplified block diagram of an exemplary traction elevator monitoring system for performing self-testing in accordance with the principles of the present invention.

FIG. 1 is a simplified block diagram of an exemplary monitoring system 10 formed in accordance with the present invention to perform and control automated self-testing of the emergency operation conditions of a traction elevator. As mentioned above and outlined in FIG. 1, monitoring system 10 is configured to transmit self-test commands to both a three-phase AC back-up power supply 20 and elevator controls 30. The commands are transmitted on a pre-programmed, scheduled basis to perform the tests on a regular schedule (perhaps once a week, for example) at times that are particularly selected to be "low demand" operation times (such as overnight), since the elevator car needs to be disconnected from the main power supply and taken out of service to perform the testing. In a preferred embodiment, an "override" of the pre-programmed schedule may be used to perform testing by on-location personnel when the need arises.

Monitoring system 10 is shown as including a self-test process module 12 that includes software-defined instructions for initializing and controlling various self-test operations, and a display unit 14 that provides a visual indication of the state of the back-up power supply. In one or more embodiments of the present invention, monitoring system 10 may include a database 16 for storing test results and a communication unit 18 for converting the received test results into a wireless signal for communication to a remotely-located maintenance control system and/or other appropriate systems and persons associated with maintenance of the traction elevator. Test results may also be transmitted along a "wired" output path to these other remote systems. In the arrangement of FIG. 1, the various components within monitoring system 10 communicate via a data bus 11. Results of self-testing operations from back-up power supply 20 and elevator controls 30 are shown as sent back to monitoring system 10, where they may be stored in database 16 and/or transmitted via communication unit 18 to proper remotely-located systems and personnel, including transmission to a cloud-based maintenance/monitoring system.

Three-phase AC back-up power supply system 20 is shown in this exemplary embodiment as comprising a stack 22 of four individual battery cells 221, 222, 223, and 224. During normal operation, a charging circuit 24 (connected to an incoming power bus) is used to maintain an acceptable charge level on the battery cells. A three-phase AC generator circuit 26 is included within back-up power supply 20 and used to convert the DC power of battery stack 22 into an acceptable three-phase AC output. A complete description of the generation of such three-phase AC back-up power from a supplied battery stack is found in U.S. Pat. No. 9,601,945, assigned to the assignee of this application and herein incorporated by reference.

The self-testing of back-up power supply 20 is two-fold, including a monitoring of the charging level of individual batteries $22i$ used to create the three-phase AC output power, as well as an evaluation of the performance of the battery stack under load conditions. Monitoring system 10 is configured to manage the charging of batteries 22 via charging circuit 24, which in this case is used to provide information to monitoring system 10 regarding the power levels of the individual batteries $22i$ and their performance during a rescue/evacuation procedure when disconnected from the main power supply.

The purpose of the self-testing is to identify a failed battery $22_i$ (or complete battery stack 22) or other failed component(s) of three-phase AC generator circuit 26 that would otherwise go undetected. For example, an "open" cell $22_i$ will allow the stack of batteries to read as "charged" on a float charger, but when a load is applied, the voltage across the stack dramatically drops. The self-test is configured to look for this drop in voltage and generate a test output signal indicative of the "failed" condition.

It is to be noted that this test is complicated by the presence of a surface charge that develops on the batteries once they are fully charged. Thus, to avoid unreliable responses, self-test process module 12 is preferably configured to disable charging circuit 24 and then run an inverter self-test. Allowing the inverter self-test to run for a fixed period of time (for example, about 10 seconds) burns off this surface charge. Then, after running the inverter self-test for about 10 seconds, the voltage of battery stack 22 is measured under load conditions. After a pause (for a time period of about 10 seconds again), a second measurement of battery voltage under load is made. A change in voltage greater than a predetermined amount (for example, more than about 2.5 volts) indicates the presence of a failed battery cell $22_i$ if the second reading is below a defined value (such as 50 vdc).

In preferred embodiments, self-test process module 12 is further configured to stop battery charging in the event that a failure in charging circuit 24 is recognized. While a normal charger will normally stop charging batteries at about 54 vdc, a charger that has gone into a "failed" condition may unknowingly continue to charge battery cells to a level well above this voltage, which may result in damage to battery cells 22, or even back-up power supply 20 itself. To prevent this run-away charging from occurring, back-up power supply 20 is shown as including a disable circuit 28, controlled by self-test process module 12, that disables charging system 24 if battery stack 22 becomes charged above a preset level (which is itself above the normal "float" charge voltage of charging system 24).

A feature of the self-testing system of the present invention is the inclusion of a visual display that allows for the appropriate personnel to know the status of a given traction elevator at any point in time. It is to be understood that any appropriate type of graphical user interface (GUI) may be used to form this display. FIG. 2 is a diagram of an exemplary display unit 14, with the understanding that the details of the included indicators may vary in their presentation and organization. In the particular design shown in FIG. 2, display unit 14 includes an LCD 40 that provides an alpha-numeric indication of the current "state" of back-up power supply 20. For example, "EPS TESTING" may be displayed during an automated self-test cycle as triggered by self-test process module 12 (an associated LED 48, defined below, is lit when testing begins). In this particular arrangement, display unit 14 includes a diagnostic LED bank utilized for trouble-shooting, with various LEDs energized upon the recognition of various "warning" conditions. In this embodiment, a first LED 42 is associated with the presence of a "low battery" condition (LOB) of a given battery cell, as detected during a self-testing cycle. First LED 42 is illuminated when the reserve battery supply drops below a predetermined float value. It is to be understood that in a preferred embodiment of the present invention, these warnings are also transmitted to maintenance personnel as described above.

Also included in display 14 of FIG. 2 is a third LED 46 that is associated with the charging process of battery stack 22. In particular, when battery stack 22 is being charged from the main power supply (a normal operation condition), third LED 46 is lit to show the state of "active charging" ("CHG"). In an exemplary configuration, third LED 46 may be designed to cycle on/off during this active charging period until the charge is above a predetermined float voltage level. LCD 40 may display a message such as "BATTS CHARGING" while this is taking place. Once the float voltage is reached, third LED 46 remains steady "on" and LCD 40 displays an updated message such as "BATTERIES CHARGED". It is to be understood that if a power loss occurs in the building during a charging cycle, the charging will be halted and a "LOW BATTERY" message preferably shown on LCD unit 40. Under these circumstances first LED 42 will turn "on". If a fault occurs during the self-test, second LED 44 will light and an appropriate message will be displayed on LCD 40. Again, these various conditions may be transmitted via wired or wireless communication links from monitoring system 10 to appropriate maintenance personnel.

Upon restoration of building power, charging circuit 24 resumes the process of recharging battery stack 22, clearing the "LOW BATTERY" condition. The LOB reset level is typically set by circuitry within circuit 24 (i.e., hardcoded in software), where a value of 50 vdc is typical. When the battery voltage is above the adjustable LOB trip point, but has not yet reached the fixed LOB reset point, alarm LED 48 may be configured to flash on/off, indicating that the charging process is within the LOB recovery hysteresis loop.

Figure 3:
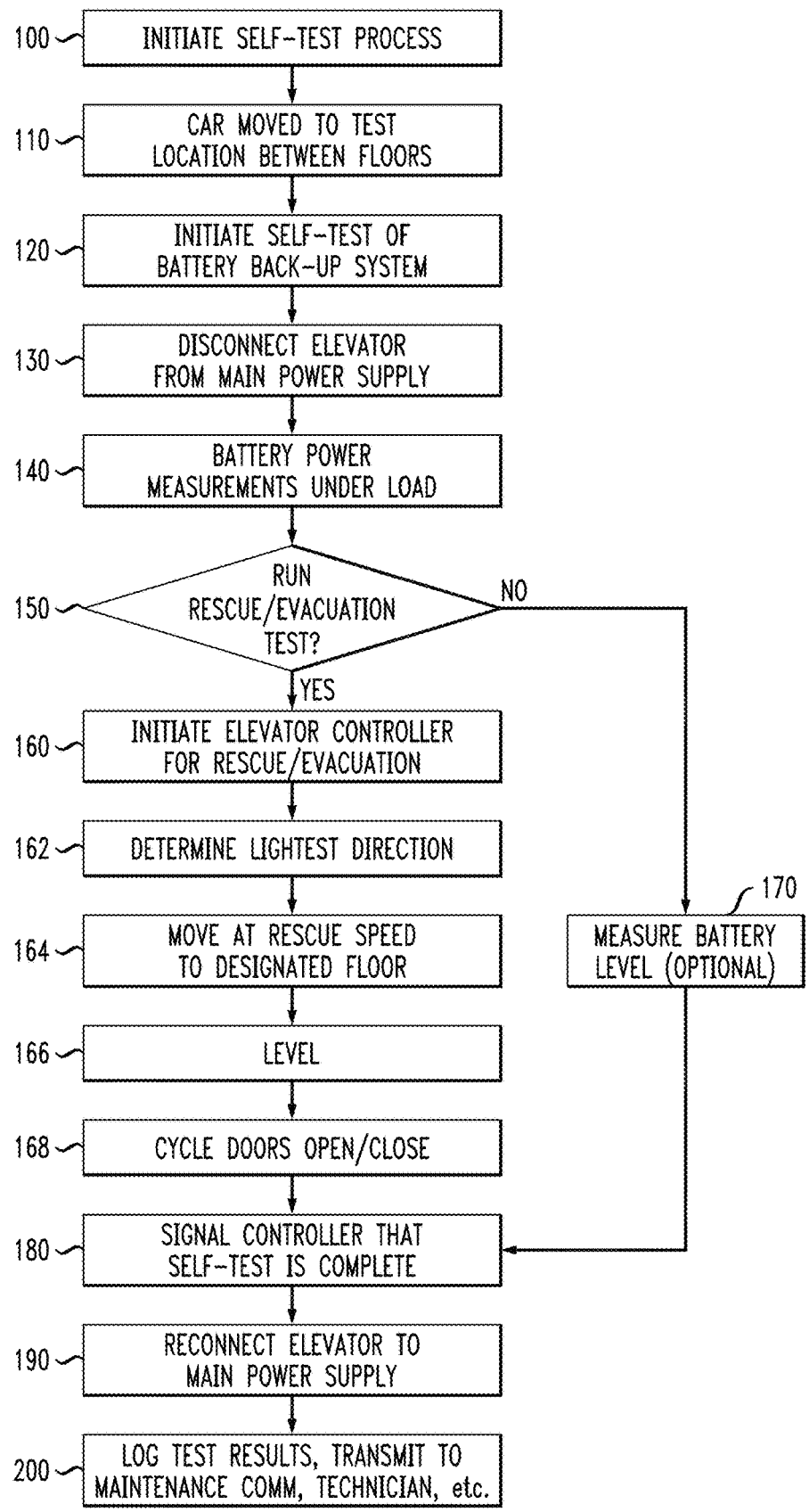
FIG. 3 contains a flowchart of an exemplary series of steps that may be used in a given self-testing process.

In accordance with the principles of the present invention, the self-testing process may be extended beyond the testing of the three-phase AC back-up power supply itself to include testing the emergency rescue/evacuation procedures performed by the elevator car (i.e., the actions of the car necessary to provide an evacuation in the case of a power failure). FIG. 3 is a flow chart of an exemplary process of the present invention that is implemented via self-test module 12 to provide both three-phase AC back-up power supply testing and elevator car evacuation testing.

As shown, an exemplary self-testing process begins at step 100 with a request to "initiate" the self-testing process. The request is generated by self-test process module 12 and is typically pre-programmed to occur at a given time in a predetermined schedule. For example, the test may be performed once a week (or perhaps once a month) during a low usage period. It is contemplated that daily self-testing is not typically necessary and may have the unintended result of reducing battery capacity.

Upon initiation, self-test process module 12 transmits a command to elevator mechanical controls 30 to move the elevator car to a designated between-floor location that is used for self-testing. At this point, the elevator car is designated as "out of service", which may be shown as a message on display unit 14. Once the elevator car is in place, self-test process module 12 transmits a command to three-phase AC back-up power supply 20 to initiate the battery testing process (step 120). This follows by disconnecting the elevator from the main power supply (step 130) and coupling the battery supply to the elevator controls. Measurements of three-phase AC power under rescue/evacuation conditions are made (step 140), which may include the sub-steps of burn-off and re-testing, as described above.

In the particular process as outlined in FIG. 3, the next step is a check to see if an elevator car rescue/evacuation process is to be included in the self-test (step 150). As mentioned above, the availability of full three-phase AC power during rescue/evacuation of a traction element is a preferred arrangement for allowing the car to quickly move to the optimum floor location, stop, and open the doors.

If the response to the elevator car testing query is "no", the process continues with the final steps as will be discussed below. Presuming the response is "yes", the process moves to step 160 and initiates elevator mechanical controls 30 to perform a rescue/evacuation routine. The drive is switched to a non-line regenerative mode and the elevator system to "test" mode, energized only by the three-phase AC back-up battery power Next, the "lightest" direction is determined for movement of the car to the nearest floor (step 162), and the car is moved at rescue (slow) speed to nearest floor (step 164). The elevator car goes through a leveling process (step 166) and energizes the door motors to cycle through an "open/closed" sequence (step 168). Once completed, the car remains at this "floor" location and the process returns to the main flow, step 170, which measures the battery level (voltage and charge) of back-up power supply system 20 to confirm that the post-testing power supply is still sufficient to execute an actual emergency process.

At this point, self-test process module 12 receives an indication that the self-test process is complete (step 180), and the elevator is re-connected to the main power supply (190). The results of the testing are logged (step 200), and perhaps stored on-board within database 16 of monitoring system 10. As mentioned above, the test results may also be communicated to a remotely-located maintenance system (including a cloud-based system which may then, in turn, relay the messages to appropriate personnel).

Advantageously, the transmission of results directly to a technician can provide alerts of a battery failure, low battery, mechanical problems with car control mechanisms, and the like. Preferably, the test results include an estimate of the number of sequential rescue/evacuation test sequences can be run without recharging the back-up power supply. This information is also an indication of when it is time to replace the batteries. In an alternative approach, the battery type and voltage history during the rescue/evacuation could be provided to the elevator controller and then sent to an AI program to determine when to replace the batteries. Thus, instead of relying upon theoretically calculated power values (as was done in the past), the generation of the actual, measured battery back-up power required to perform the rescue/evacuation procedures may be used to provide not only immediate power capabilities, but trended to provide information regarding its capability to perform future rescues.

FIG. 4 is an isometric view of three-phase AC back-up power supply 20 as packaged within a housing 50. Advantageously, the modular nature of back-up power supply 20 allows for easy access to (and replacement of, if necessary) individual elements. The particular configuration of housing 50 as shown in FIG. 4 includes an interior shelf 52, with display 14 and a pair of batteries from the stack (here, batteries $22_1$ and $22_3$) disposed on this shelf. A remaining pair of batteries $22_2$ and $22_4$, as well as main power switch/circuit breaker 27, are disposed on the lower shelf. In this particular arrangement, self-test process module 12 of monitoring system 10 interacts with a circuit board 54 that supports charging circuit 24 and three-phase AC generator circuit 26, where circuit board 54 is positioned behind batteries 22 along a rear wall 56 of housing 50.

The foregoing description for purposes of explanation, used specific nomenclature to provide a thorough understanding of the invention. However, it will be apparent to one skilled in the art that specific details are not required in order to practice the invention in its broadest configuration. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A method of performing automatic self-testing of a traction elevator under conditions simulating a power failure, the method including the steps of:
   a) defining a self-testing schedule for performing a test sequence for the traction elevator;
   b) in response to a prompt from the self-testing schedule to initiate a testing sequence, performing the following:
      b1) moving an elevator car being tested to a test location between floors;
      b2) disconnecting the elevator car from a main power supply;
      b3) measuring, under an AC load, the voltage and charge of a three-phase AC back-up battery source for the elevator car, the three-phase AC back-up battery source comprising a battery stack and a three-phase power generator circuit;
      b4) recording voltage and charge measurement results and transmitting test results to appropriate maintenance systems; and
      b5) reconnecting the elevator car to the main power supply; and
   c) monitoring the self-testing schedule; and
   d) repeating steps b1) b5) upon receipt of each message to initiate self-testing.

2. The method as defined in claim 1 wherein in performing step b3), the following steps are utilized:
   disconnecting the battery stack from a battery charger;
   performing an inverter self-test for a period of time sufficient to eliminate surface charge from the battery stack;
   measuring the voltage of the battery stack under the AC load; and
   waiting for a predetermined period of time and then performing a second measurement of the voltage of the battery stack, wherein if the second measurement is below a predetermined value, a test result message of "failed" battery is transmitted.

3. The method as defined in claim 1, wherein prior to performing step b5), an elevator car rescue/evacuation sequence is performed, including the steps of:
   coupling the three-phase AC back-up battery source to the elevator car;
   using the coupled three-phase AC back-up battery source, energizing an AC motor to provide movement of the elevator car to a designated floor,
   energizing a braking system to halt movement of the elevator car upon reaching the designated floor, and
   measuring and recording the voltage and charge of the three-phase AC back-up battery source used to energize the AC motor and the braking system;
   energizing a set of door motors to cycle through an open/close sequence,
   measuring and recording the voltage and charge of the three-phase AC back-up battery source used to energize the set of door motors; and
   transmitting the recorded voltage and charge results to appropriate maintenance systems.

4. The method as defined in claim 3 wherein the step of energizing the AC motor to provide movement of the elevator car to the designated floor further includes the step of leveling the elevator car with respect to a door threshold, using the coupled three-phase AC back-up battery source to perform the leveling.

5. The method as defined in claim 3 wherein the method further performs the steps of:
   measuring a reserve power of the battery stack within the three-phase AC back-up battery source after completing the rescue/evacuation sequence; and
   using the measured reserve power, determining a number of subsequent self-tests that may be performed prior to recharging the battery stack within the three-phase AC back-up battery source.

6. The method as defined in claim 5 wherein a plurality of reserve measurements, recorded over an extended period of time, are utilized for defining a trend for determining a number of remaining self-testing and re-charging sequences that may be performed prior to requiring replacement of the battery stack.

7. The method as defined in claim 6, wherein the step of defining a trend further includes the step of:
   scheduling a maintenance event date for replacing the battery stack.

\* \* \* \* \*